(12) United States Patent
Schulze et al.

(10) Patent No.: US 7,344,936 B2
(45) Date of Patent: Mar. 18, 2008

(54) SEMICONDUCTOR WAFER WITH A WIRING STRUCTURE, A SEMICONDUCTOR COMPONENT, AND METHODS FOR THEIR PRODUCTION

(75) Inventors: Hans-Joachim Schulze, Ottobrunn (DE); Helmut Strack, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/427,204

(22) Filed: Jun. 28, 2006

(65) Prior Publication Data

US 2007/0023881 A1 Feb. 1, 2007

(30) Foreign Application Priority Data

Jun. 28, 2005 (DE) ............... 10 2005 030 466

(51) Int. Cl.
*H01L 21/8238* (2006.01)
(52) U.S. Cl. ............... 438/209; 438/459; 438/977; 257/503
(58) Field of Classification Search ........ 438/459, 438/977, 612, 618, 625, 648; 257/E21.088, 257/E21.122, E21.567, E23.04, 503
See application file for complete search history.

(56) References Cited

U.S. PATENT DOCUMENTS

| | | | | |
|---|---|---|---|---|
| 5,376,580 | A | 12/1994 | Kish et al. | 437/127 |
| 5,506,452 | A | 4/1996 | Kuhnert | 257/785 |
| 5,744,852 | A | 4/1998 | Linn et al. | 257/506 |
| 5,801,084 | A * | 9/1998 | Beasom et al. | 438/457 |
| 6,075,275 | A * | 6/2000 | Irissou | 257/458 |
| 6,323,108 | B1 * | 11/2001 | Kub et al. | 438/458 |
| 2002/0068488 | A1 | 6/2002 | Tuller et al. | 439/775 |
| 2007/0148422 | A1* | 6/2007 | Schulze et al. | 428/209 |

FOREIGN PATENT DOCUMENTS

| | | |
|---|---|---|
| DE | 3139069 A1 | 10/1981 |
| DE | 10007167 A1 | 2/2000 |
| DE | 102004054147 A1 | 11/2004 |
| EP | 0616376 B1 | 1/1994 |
| EP | 0638928 B1 | 7/1994 |
| EP | 0867941 A2 | 3/1998 |
| JP | 60113941 A | 11/1983 |
| JP | 2004043225 A | 7/2002 |
| JP | 2004080042 A | 8/2003 |

OTHER PUBLICATIONS

Hultman L. Prof; "Materials Science of MAX-Phase Thin Films"; Gordon Laboratory Seminar Series Abstracts; 2 Pgs., 2005.

* cited by examiner

*Primary Examiner*—Hsien-Ming Lee
*Assistant Examiner*—Ankush K Singal
(74) *Attorney, Agent, or Firm*—Eschweiler & Associates, LLC

(57) ABSTRACT

A semiconductor wafer is provided with a wiring structure, and semiconductor chip positions arranged in rows and columns. The semiconductor wafer has at least one coating (6) as a self-supporting dimensionally stable substrate layer (4), and/or as a wiring structure composed of conductive, high-temperature-resistant material. The coating material (6) of the substrate layer (4) and/or of the wiring structure has a ternary carbide and/or a ternary nitride and/or carbon.

14 Claims, 5 Drawing Sheets

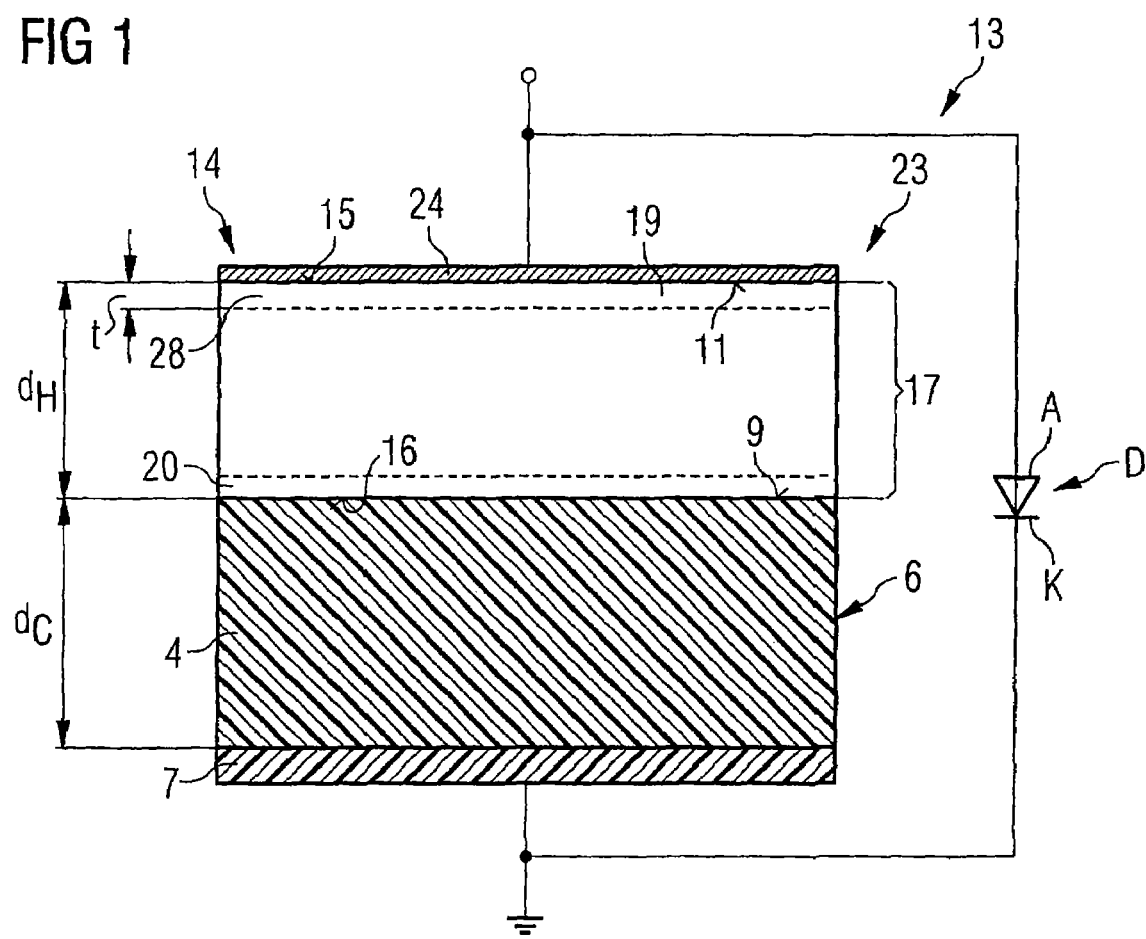

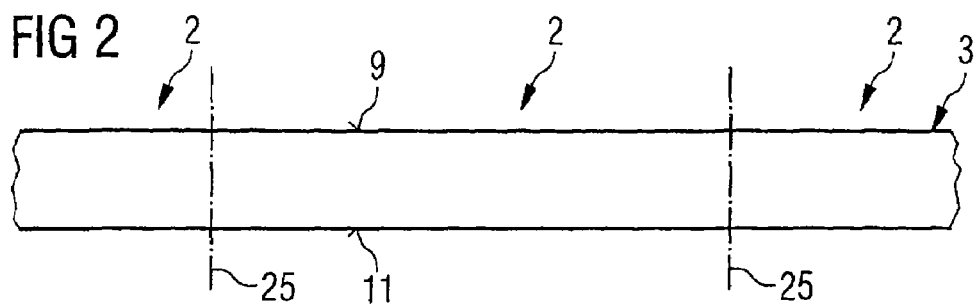
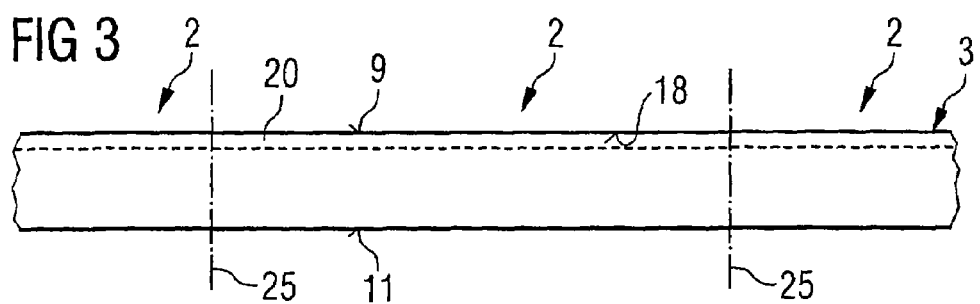
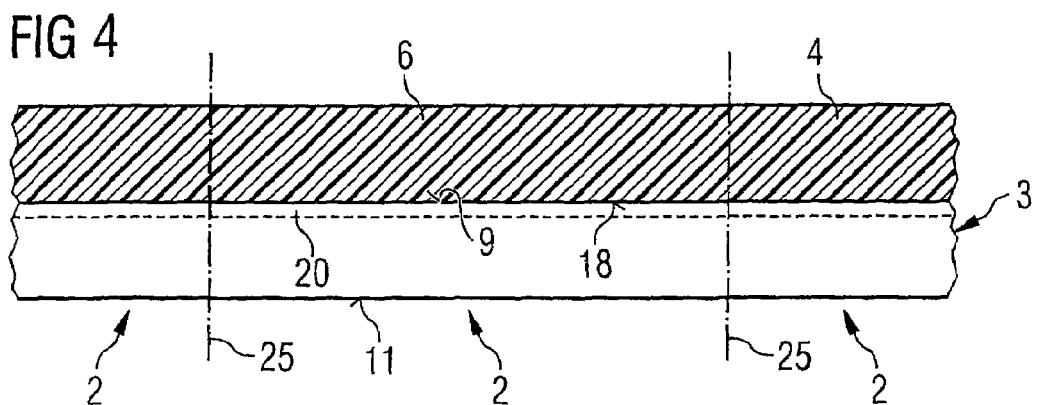
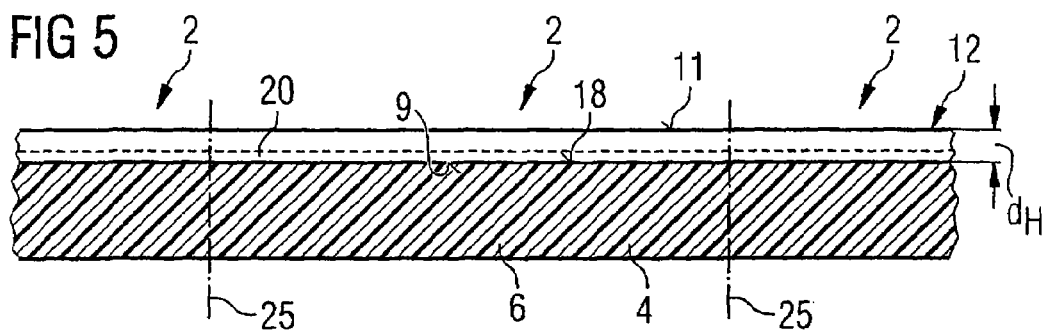

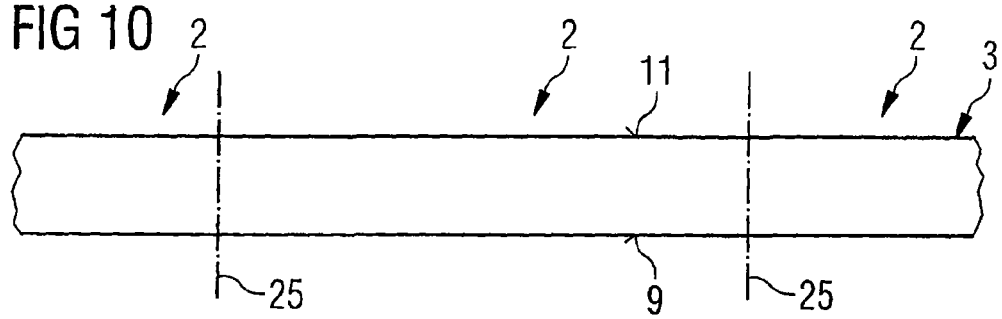
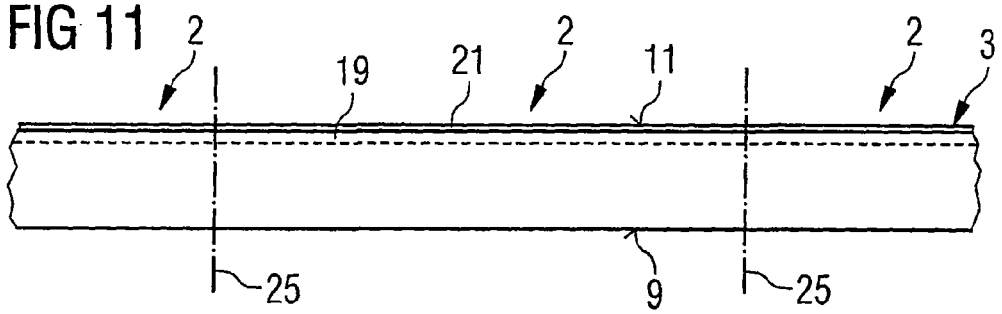
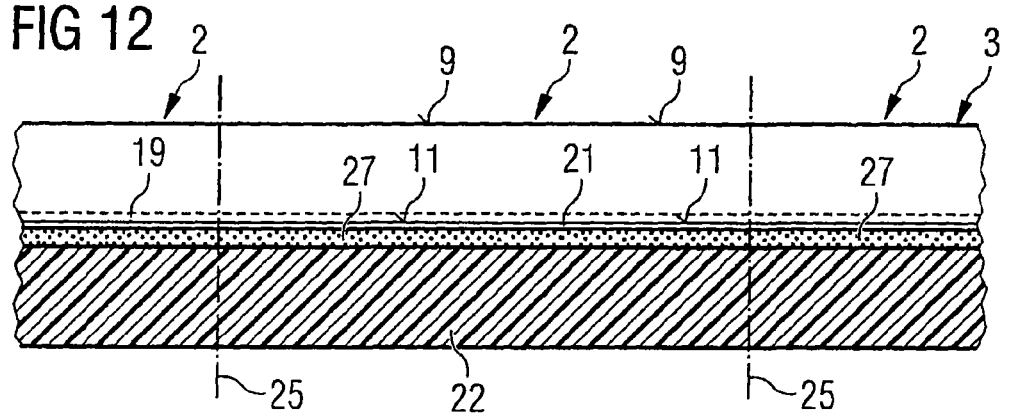
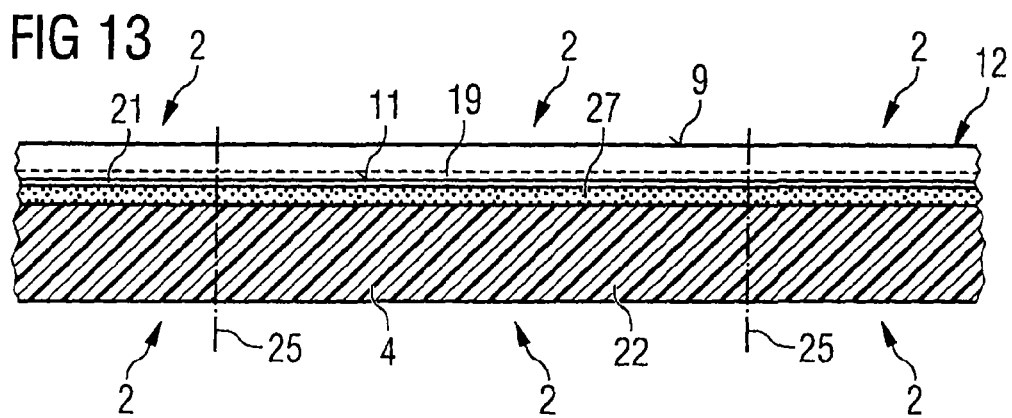

SEMICONDUCTOR WAFER WITH A WIRING STRUCTURE, A SEMICONDUCTOR COMPONENT, AND METHODS FOR THEIR PRODUCTION

PRIORITY

This application claims priority from German Patent Application No. DE 10 2005 030 466.4, which was filed on Jun. 28, 2005, and is incorporated herein by reference in its entirety.

TECHNICAL FIELD

The invention relates to a semiconductor wafer with a wiring structure, to a semiconductor component with a semiconductor chip, and to methods for their production.

BACKGROUND

The invention relates in particular to thinned semiconductor wafers and thinned semiconductor chips, as are described in patent application DE 10 2004 054 147. Thinned semiconductor wafers and thinned semiconductor conductor chips such as these are used for power diodes, field-effect power transistors and other semiconductor components, in order, for example, to reduce the on-state resistance. In addition, thinned semiconductor wafers and thinned semiconductor chips such as these are also used for semiconductor modules, in order to drastically reduce the semiconductor component height.

Both in manufacture and in handling, these thinned semiconductor wafers and thinned semiconductor chips are considerable disadvantages, since they are mechanically at risk and must nevertheless be provided with wiring structures on their upper faces and with contact layers on their rear faces. As described in patent application DE 10 2004 054 147, the semiconductor wafers and semiconductor chips are fixed on intermediate mounts for manufacture and for handling, in order to absorb the loads which occur during handling and manufacture.

One disadvantage of fixing on an intermediate mount is the additional manufacturing effort for fitting and removal of the intermediate mount, which may be associated not only with contamination of the high-purity semiconductor material with contaminants through the material of the intermediate mount, but is also associated with an increased risk of fracture of the thinned semiconductor wafer or the thinned semiconductor chip.

Furthermore, one disadvantage of semiconductor wafers and semiconductor chips, in particular for power applications, is that a metallic wiring structure may be required on the semiconductor wafer or on the semiconductor chips, in order to commit the integrated circuit close to the surface to external contacts of the semiconductor component. Wiring structures such as these are provided by metals, which decrease the thermal operating range of the semiconductor elements, since they have a tendency to migration and to reaction with the semiconductor material, so that the theoretical limit of the thermal load capacity of a semiconductor material such as silicon is not reached. In addition, thermal process steps after metallization are restricted to low temperatures.

Finally, after metallization, the semiconductor wafers and the semiconductor chips are provided on their surfaces with a passivation layer or protective layer, which is deposited from the gas phase at low temperatures. Owing to the limited thermal load capacity of the metallic wiring layers on a semiconductor wafer or a semiconductor chip, passivation layers such as these, which are deposited at low temperatures, do not have a high density, and thus are not sufficiently thermally stable, so that the reliability of the semiconductor components in the case of semiconductor wafers and semiconductor chips with passivation layers such as these is decreased.

SUMMARY

A semiconductor wafer with wiring structures of semiconductor chip positions arranged in rows and columns can be provided, with the semiconductor wafer having at least one coating as a self-supporting dimensionally stable substrate layer, and/or as a wiring structure composed of conductive and temperature-resistant material. The coating material of the substrate layer and/or of the wiring layer may comprise a ternary carbide and/or a ternary nitride and/or carbon.

BRIEF DESCRIPTION OF THE DRAWINGS

The invention will now be explained in more detail with reference to the attached figures.

FIG. 1 shows, schematically, a power diode from a semiconductor chip, according to a first embodiment;

FIGS. 2 to 9 show schematic cross sections through a section of a semiconductor wafer during the production of a semiconductor chip, according to a first method example;

FIG. 2 shows a schematic cross section through a section of a semiconductor wafer;

FIG. 3 shows a schematic cross section through the section of the semiconductor wafer as shown in FIG. 2, after preparation of the areas of the semiconductor wafer close to the rear face;

FIG. 4 shows a schematic cross section through the section of the semiconductor wafer as shown in FIG. 4, after application of a substrate layer to the prepared rear face of the semiconductor wafer;

FIG. 5 shows a schematic cross section through the section of the semiconductor wafer as shown in FIG. 4, after thinning of the semiconductor wafer;

FIG. 6 shows a schematic cross section through the section of the semiconductor wafer as shown in FIG. 5, after sealing of the substrate layer;

FIG. 7 shows a schematic cross section through the section of the semiconductor wafer as shown in FIG. 6, after introduction of semiconductor element structures into those areas of the semiconductor wafer which are close to the surface, and after application of an isolation structure to the upper face of the semiconductor wafer;

FIG. 8 shows a schematic cross section through the section of the semiconductor wafer as shown in FIG. 7, after application of a wiring structure to the isolation structure;

FIG. 9 shows a schematic cross section through the section of the semiconductor wafer as shown in FIG. 8, after application of a passivation layer to the wiring structure, and after cutting the semiconductor wafer into semiconductor chips;

FIGS. 10 to 17 show schematic cross sections through a detail of a semiconductor wafer during the production of a semiconductor chip, according to a second method example;

FIG. 10 shows a schematic cross section through a section of a semiconductor wafer;

FIG. 11 shows a schematic cross section through the section of a semiconductor wafer as shown in FIG. 10, after introduction of semiconductor element structures into areas of the semiconductor wafer which are close to the surface, and after application of an isolation structure to the surface of the semiconductor wafer;

FIG. 12 shows a schematic cross section through the section of a semiconductor wafer as shown in FIG. 11, after adhesive bonding of the semiconductor wafer by its upper face to an intermediate mount;

FIG. 13 shows a schematic cross section through the section of a semiconductor wafer as shown in FIG. 12, after thinning of the semiconductor wafer from its rear face;

FIG. 14 shows a schematic cross section through the section of a semiconductor wafer as shown in FIG. 13, after preparation of areas of the semiconductor wafer which are close to the rear face;

FIG. 15 shows a schematic cross section through the section of a semiconductor wafer as shown in FIG. 14, after application of a substrate layer to the rear face of the semiconductor wafer;

FIG. 16 shows a schematic cross section through the section of a semiconductor wafer as shown in FIG. 15, after removal of the intermediate mount and after application of a wiring structure to the isolation structure; and FIG. 17 shows a schematic cross section through the section of a semiconductor wafer as shown in FIG. 16, after application of a passivation layer to the wiring structure.

DETAILED DESCRIPTION

Figure 6:
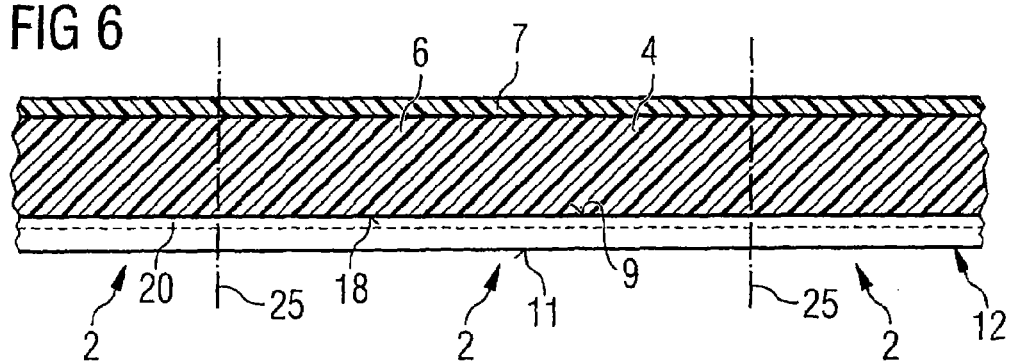

A semiconductor wafer such as described above which has a self-supporting dimensionally stable substrate layer composed of a ternary carbide and/or a ternary nitride and/or carbon has the advantage that the semiconductor wafer can be thinned to a thickness of just a few micrometers, since the self-supporting dimensionally stable substrate layer ensures the mechanical strength of the semiconductor wafer while the various manufacturing steps are being carried out. Furthermore, these substrate layer materials are temperature-resistant, such that high-temperature processes, such as fault-point diffusion and doping processes, can be carried out on the upper face of the thinned semiconductor wafer with the substrate layer according to an embodiment without adversely affecting the purity of the thinned semiconductor material.

A second advantage of the substrate layer is its high electrical conductivity, which is possible in particular in the case of ternary carbides and ternary nitrides as well as in the case of carbon, so that, initially, there is no need for a metallic rear-face contact for the thinned semiconductor wafer. If needed at all, such metallization is carried out only on a rear face of the substrate layer, facing away from the semiconductor wafer.

In principle, these high-temperature-resistant and conductive materials composed of ternary carbide and/or ternary nitride and/or carbon are suitable as wiring structures for the semiconductor component positions arranged in rows and columns on a semiconductor wafer. In this case, it does not matter that the semiconductor wafer is thinned. Wiring structures such as these are also advantageous for self-supporting semiconductor wafers which have semiconductor component positions for power components since, on the one hand, the high conductivity of ternary carbides and/or ternary nitrides and/or carbon can be used for the wiring structure, and on the other hand the high-temperature-resistance of these materials means that it is possible to provide a high-temperature-resistant wiring structure on the upper face of a semiconductor wafer, irrespective of whether this is a self-supporting semiconductor wafer or a thinned semiconductor wafer with a substrate layer. A thinned semiconductor wafer can preferably have an upper-face wiring structure which is sufficiently thick to be used as a substrate structure for the thinned semiconductor wafer.

A conductive and high-temperature-resistant wiring structure such as this has the advantage that it can be protected by passivation layers which can be deposited at high temperature from the gas phase with a correspondingly improved density of the passivation layers. A passivation layer such as this which is deposited at high temperatures from the gas phase thus has the advantage that the reliability of the semiconductor wafer and of the semiconductor chip, and hence of the semiconductor component, can be improved. Furthermore, the temperature load on a semiconductor component such as this can also be increased, because the conductive high-temperature-resistant materials of the wiring structure do not form intermetallic phases with the material of the semiconductor wafer, as can disadvantageously occur in the case of metallic wiring structures. Furthermore, migrations and chemical reactions to the upper face and with the rear face of the semiconductor material are largely prevented, in particular with no "spiking effects" occurring on the rear face, as in the case of conventional aluminum metallization, thus improving the reliability of the components.

Three-substance systems are preferably used for the ternary carbides and ternary nitrides and, in addition to the elements carbon and nitrogen, have one element from the group of transition metals Sc, Ti, Cr, V, Zr, Nb, Mo, HF and/or Ta. The semiconductive components from the elements in the group Al, Si, P, S, Ga, Ge, As, Cd, In, Sn, Te and/or Pb may be used as the further element in the three-substance systems based on carbon or nitrogen. Highly conductive and high-temperature-resistant materials of the 2-1-1 type are known from these three groups, whose compound molecules comprise two transition metal atoms from the above group, one semiconductor element from the above group and either carbon or nitrogen. Only forty carbides of the 2-1-1 composition are known and may be used for the application. In the case of the nitride, 10 such solid and stable ternary compounds of the 2-1-1 type exist. Furthermore, carbides are preferably used for the application which are of the 3-1-2 type, such as titanium aluminum carbide ($Ti_3AlC_2$), titanium germanium carbide ($Ti_3GeC_2$) or titanium silicon carbide ($Ti_3SiT_2$). A further ternary compound as a ternary nitride is of importance, and is of the 4-1-3 type with titanium aluminum nitride ($Ti_4AlN_3$).

The carbon which can likewise be used for the semiconductor component may be in the form of amorphous carbon or crystalline carbon in the form of graphite, and may also have mixed forms.

In one preferred embodiment, the conductive and temperature-resistant material, irrespective of whether this is for the self-supporting dimensionally stable substrate layer and/or for the wiring structure, has a donor ion concentration and/or acceptor ion concentration which increases the electrical conductivity at the operating temperature. As the temperature rises, the ionization of such donor ion concentrations and/or acceptor ion concentrations which increase the electrical conductivity becomes greater, since the material which is impregnated with donor atoms or acceptor atoms at substitution lattice locations releases excess electrons of the substitutional donor atoms or acceptor atoms as the temperature rises, resulting in an increasing ionization level with correspondingly freely mobile electrons or holes in the lattice of the ternary compound crystals.

In a further preferred embodiment of the semiconductor wafer, a high-temperature-resistant sealing covering layer is arranged on the substrate layer. This covering layer ensures that the atoms in the substrate layer do not contaminate or dope the high-purity thinned semiconductor wafer composed of monocrystalline semiconductor material during the intended high-temperature processes in order to introduce doped zones, for example in order to provide an integrated circuit structure in the areas of the semiconductor wafer close to the surface. A sealing covering layer such as this, which is also at the same time resistant to high temperatures, may, for example, be composed of deposited polysilicon.

Also, a high-temperature-resistant passivation layer can be provided to be arranged on the wiring structure. This passivation layer may preferably be composed of silicon nitride and, because of the possible high-temperature deposition, is denser and more reliable than passivation layers which are deposited in the prior art at correspondingly low temperatures from the gas phase, preferably of an organometallic compound. The higher density of the high-purity deposited silicon nitride as a passivation layer at correspondingly high temperatures on the wiring structure from a ternary carbide and/or a ternary nitride and/or carbon results, for example, in the capability to operate semiconductor chips based on silica with the maximum permissible operating temperature for PN junctions in silica during operation, without changing the wiring structure on the upper face of the silicon chip.

In a further embodiment, the substrate layer comprises a carbon which is deposited pyrolytically on the rear face of the semiconductor wafer, and/or a pyrolytically deposited ternary carbide, and/or a pyrolytically deposited ternary nitride. The pyrolytic deposition of such materials has the advantage that a self-supporting conductive and high-temperature-resistant layer is formed on the rear face of the semiconductor wafer.

For a conductive high-temperature-resistant wiring structure, the semiconductor wafer preferably comprises a carbon, which is pyrolytically deposited on the upper face of the semiconductor wafer, and/or a pyrolytically deposited ternary carbide and/or a pyrolytically deposited ternary nitride which, however, is deposited in such a manner that it does not form a self-supporting substrate layer but only a thin layer with a thickness of a few micrometers, composed of a conductive high-temperature-resistant material. The particular feature of the pyrolytically deposited layer provides the advantage of a homogeneously distributed material on the upper face of the semiconductor wafer. This uniformly and homogeneously deposited material in the form of a wiring layer can then be formed by means of selective dry etching, preferably by means of a plasma containing oxygen, to create a conductive high-temperature-resistant wiring structure.

In a further embodiment, the semiconductor wafer comprises conductive high-temperature-resistant wiring structures which are coated a plurality of times one above the other, on its upper face which wiring structures comprise a ternary carbide and/or a ternary nitride and/or carbon. The normal isolation layers can be provided between these conductive high-temperature-resistant wiring structures, and the passivation layer already mentioned above can follow this, as the final layer. The coatings, thus, replace the previously normal metal levels 1, 2 and 3 in large-scale-integrated circuits by the wiring structures composed of ternary carbide and/or ternary nitride and/or carbon. If one of these coatings, preferably the uppermost conductive power metallization, is replaced by a sufficiently thick coating with the thickness $d_v$ in the order of magnitude of 50 $\mu m \leq d_v \leq 150$ $\mu m$, this can also be used as a self-supporting structured substrate layer.

The various variants and combinations of thinned semiconductor wafers with and without a substrate layer and with and without a wiring structure will now be described in the following statements. Among these options, a thinned semiconductor wafer with a conductive self-supporting substrate layer should be particularly stressed. A thinned semiconductor wafer such as this is just as stable as a previously normal thick semiconductor wafer with a thickness of, for example, 350 $\mu m$ to 900 $\mu m$. In contrast, the semiconductor material on the conductive self-supporting substrate layer with the thickness $d_c$ of 50 $\mu m \leq d \leq 300$ $\mu m$ now has a thickness of a few 10 $\mu m$. Nevertheless, a large number of electronic circuits can be provided by integration on the surface of the semiconductor wafer, and improved characteristics can be achieved, in particular with respect to the on-state resistance of individual semiconductor elements in the individual semiconductor positions.

A further preferred variant provides for the conductive self-supporting substrate layer to be fitted with a thinned semiconductor wafer with at least one conductive high-temperature-resistant wiring structure arranged on the upper face of the thinned semiconductor wafer at the semiconductor chip positions. This combination of both, specifically of a substrate layer on the lower face of the thinned semiconductor wafer and a wiring layer on the upper face of the semiconductor wafer, in each case composed of a ternary carbide and/or a ternary nitride and/or carbon, allows a semiconductor component whose thickness and temperature resistance have been optimized and which is distinguished by particularly high mechanical robustness, by particularly high temperature resistance and by excellent conductivity both of the wiring structure and of the substrate layer on the rear face.

Furthermore, a variant is possible in which a self-supporting semiconductor wafer comprises at least the conductive temperature-resistant wiring structure on its upper face at the semiconductor chip positions. In this case, only the pyrolytically deposited layer discussed above and composed of a ternary nitride and/or a ternary carbide and/or carbon is applied, and is then structured by means of the dry etching step which has already been mentioned.

A further embodiment comprises at least one semiconductor component which comprises at least one semiconductor chip, with the semiconductor chip having at least one coating comprising a self-supporting dimensionally stable substrate layer and/or as the wiring structure composed of conductive and temperature-resistant material. The coating material of the substrate layer and of the wiring structure for this semiconductor component comprises a ternary carbide and/or a ternary nitride and/or carbon.

The semiconductor component has the advantage that the semiconductor chip can on the one hand be supported by a self-supporting dimensionally stable substrate layer composed of a ternary carbide and/or a ternary nitride and/or carbon, in such a manner that the thickness of the semiconductor chip may be only a few tens of micrometers, and is nevertheless sufficiently mechanically robust that the semiconductor chip withstands, for example, a semiconductor wafer with corresponding semiconductor chip positions being sawn out. The further processing, such as the application to a higher-level substrate mount and the wiring of its upper face, which has corresponding contact pads on an integrated circuit, with wiring on a higher-level circuit mount, can also be carried out without damage.

The loads which occur during packaging in a plastic package compound can be completely and entirely absorbed on the basis of the self-supporting dimensionally stable substrate layer even though the semiconductor chip thickness is only a few tens of micrometers. A further advantage is the thermal expansion behavior of the substrate layer material, which can be matched better to the thermal expansion behavior of silica by virtue of the ternary carbides and/or ternary nitrides, or by virtue of the carbon, than is possible with any of the plastic substrates or metal substrates which are known from the prior art.

A further advantage is that it is not only possible to provide a semiconductor chip with a self-supporting dimensionally stable substrate layer which has no "spiking effects", such as those which occur when using aluminum metallizations, but to equip the semiconductor chip additionally or alternatively with a high-temperature resistant and conductive wiring structure. The metallic wiring structures that are normally used nowadays, as well as wiring structures composed of polysilicon, exhibit electromigration faults at high current loads, and/or chemical reactions with the surrounding materials, in particular with the high-purity silicon semiconductor material of the semiconductor chip. The ternary nitrides, ternary carbides or carbon make it possible to produce wiring structures which on the one hand are compatible with high temperatures so that the maximum temperature of the silicon material can be exhausted, and on the other hand of a conductivity to allow configuration as a wiring structure.

For this purpose, the coating material may have a donor ion concentration and/or acceptor ion concentration which increases the electrical conductivity at room temperature.

The wiring structure and/or the substrate layer may have the conductive and high-temperature-resistant material as pyrolytically deposited substances. The wiring structures on the semiconductor chip may also have conductive high-temperature-resistant wiring structures which are coated a plurality of times one above the other. The already known and/or more highly compressed isolation layers can be arranged between the layers of the different wiring structures. The wiring structure on a semiconductor chip such as this is protected by a passivation layer which is deposited at high temperatures from the gas phase and, because of the high-temperature deposition, has a greater density than the low-temperature depositions, which were previously possible and used in technology, from organometallic compounds in the gas phase.

The substrate layer of a semiconductor chip such as this in a semiconductor component may additionally have a sealing covering layer composed of a high-melting-point and/or highly conductive layer. A sealing covering layer such as this has the advantage that it can be used at the same time as an external contact pad for the rear face of the semiconductor chip. On the other hand, it is also possible to apply a sealing covering layer only temporarily, in order to ensure that the rear face of the substrate layer is protected during corresponding high-temperature processing of the semiconductor chip or of the semiconductor wafer from which the semiconductor chip is manufactured, so that the substrate material does not contaminate the high-purity semiconductor material. On the other hand, if it is composed of an insulating material, such as an amorphous silicon dioxide, this sealing covering layer can also be removed after the high-temperature step and is no longer present, with metallization being provided on the rear face of the semiconductor chip instead of this.

The different molecular compounds of the ternary nitrides and ternary carbides which the semiconductor chip of the semiconductor component has exhibit the same range of variation as for the semiconductor wafer described above, on the assumption that both the wiring structure and the substrate layer are not first formed on a semiconductor chip but are already available with the semiconductor component positions on an appropriately prepared semiconductor wafer for the assembly of semiconductor components. Semiconductor components such as these are preferably power semiconductor components from the group MOSFET, IGBT, JFET, PIN-diode or Schottky-diode with a drift path which has charge compensation areas.

Four method variants are discussed in the following methods, and semiconductor wafers are prepared in three different ways for this purpose, in which case a first method example relates to the provision of a substrate layer on the rear face of a semiconductor wafer, of the upper face being ground thin, and the upper face then being structured in appropriate high-temperature steps, either by epitaxial steps and/or by diffusion and implantation steps.

In a second method example, the grinding thin process is dispensed with, but a wiring structure is applied to a self-supporting semiconductor wafer for this purpose, and comprises the ternary carbides, ternary nitrides or carbon as the material of the wiring structure.

In a third method example, an intermediate mount is used on the basis of a conventional pattern, and is also removed again before the end of the method in order to produce a ground-thinned semiconductor wafer with a corresponding self-supporting substrate layer.

A fourth method example illustrates the sequence of the method steps which can be required in order first of all to carry out thin grinding with the support of a substrate layer and in order then not only to introduce an integrated circuit then on the upper face in the area of the semiconductor chip close to the surface, but also to connect up this integrated circuit by means of a conductive high-temperature-resistant wiring structure.

In order to avoid repetitions, the four method variants for production of a semiconductor wafer are described in detail and the semiconductor chips are produced from the semiconductor chip positions of the resultant semiconductor wafers using the normal technical methods of separation of the semiconductor chips from the semiconductor wafer, electrical connection of the semiconductor chip to higher-level substrate mounts and, finally, packing of the semiconductor chip to form a semiconductor component, using the normal technologies from semiconductor process engineering, without describing these in detail.

A first method example relating to the production of a semiconductor wafer has the following method steps. First of all, a semiconductor wafer is produced having a large number of semiconductor chip positions arranged in rows and columns, with suitable dopant concentrations being introduced into the rear face of the semiconductor wafer, in areas which are close to the rear face, for appropriate flat resistive junctions. This means that the unthinned wafer is subjected to implantation and/or diffusion steps on the rear face, which are intended to ensure a flat resistive junction between the semiconductor material and the adjacent coatings on the rear face. A conductive, self-supporting substrate layer is then deposited on the rear face, and comprises a ternary carbide and/or a ternary nitride and/or carbon. In consequence, the semiconductor wafer initially admittedly becomes somewhat thicker, but it is subsequently now thinned from the upper face, and the upper face is subsequently polished. This ground-thin and polished semiconductor wafer is now held together only by the self-supporting dimensionally stable substrate layer as a semiconductor wafer. Circuit structures can now be applied to the upper face of the thinned semiconductor wafer in areas close to the surface and at the semiconductor chip positions. In this case, it is also possible to achieve a predetermined structure for field-effect power components on the upper face by growing epitaxial layers at appropriately high temperatures.

Furthermore, high-temperature diffusions are carried out after corresponding implantations, and vice versa. These high-temperature processes can be carried out because no metallization is arranged on the rear face of the semiconductor wafer, with a supporting coating composed of a conductive, high-temperature-resistant, ternary silicon carbide and/or ternary silicon nitride and/or carbon being arranged on it instead. Once the circuit structures have been completed, wiring structures and isolation structures are applied at the semiconductor chip positions on the upper face of the semiconductor wafer. These can be produced using a conventional technique from different metal and silicon layers. For completion, a passivation layer is also applied to the wiring structures and/or the isolation structures, leaving metallic contact pads free. These metallic contact pads are created automatically when metallization is carried out as the last conductive wiring structure.

In a further embodiment, once the conductive, self-supporting substrate layer has been deposited, a sealing covering layer is arranged on the substrate layer on the rear face of the semiconductor wafer. This has the advantage that the high-purity, monocrystalline silicon of the thinned semiconductor wafer is protected against contamination of the substrate layer to which the semiconductor wafer is fitted. This protective and sealing covering layer may itself be produced from a conductive high-temperature-resistant material, or from an isolating layer, which is removed again once the high-temperature processes have been carried out. A conductive self-supporting substrate layer is preferably deposited on the rear face of the semiconductor wafer by means of pyrolysis.

A second method example relating to the production of a semiconductor wafer has the following method steps. First of all, as in the first method example, a semiconductor wafer is produced having a plurality of semiconductor chip positions arranged in rows and columns, with the rear face of the semiconductor wafer having suitable dopant concentrations in areas close to the rear face for corresponding flat resistive junctions. Then, however, this semiconductor wafer is not ground thin and is also not provided with a substrate layer, but is further processed as a self-supporting semiconductor wafer. For this purpose, circuit structures are introduced in areas close to the surface at semiconductor chip positions, as already described above. Finally, a conductive, high-temperature-resistant wiring layer is deposited on the upper face of the semiconductor wafer, with the wiring layer comprising a ternary carbide and/or a ternary nitride and/or carbon. The conductive, high-temperature-resistant wiring layer is then structured to form a wiring structure. A passivation layer is then deposited on the wiring structure, leaving free contact pads which comprise a ternary carbide and/or a ternary nitride and/or a carbon.

If required, these contact pads are then finally also metallized, in order to allow the contact pads to be connected to corresponding contact connecting pads on substrate mounts. In this method example, only the wiring structure is used for a semiconductor wafer. One advantage of this method results just from the deposition of this wiring structure, in that a semiconductor wafer is produced having semiconductor chip positions and high-temperature-resistant wiring structures at the semiconductor chip positions. These high-temperature-resistant wiring structures allow the semiconductor chips which are manufactured from the semiconductor wafer to be thermally loaded up to the temperature load limit of the respective semiconductor material.

During the deposition of the conductive, high-temperature-resistant wiring layer for the wiring structure, a ternary carbide and/or a ternary nitride and/or carbon are/is deposited on the upper face of the semiconductor wafer, preferably by means of pyrolysis. This has the advantage, as already mentioned above, that a highly conductive and high-temperature-resistant layer is created which, for example, is structured by dry etching in an oxygen plasma. Other deposition methods are preferably also used, in particular vapor deposition, sputtering and/or chemical deposition from the gas phase (CVD). If the thickness $d_v$ of this highly conductive, high-temperature-resistant wiring layer is deposited in an order of magnitude 50 $\mu m \leq d_v \leq 150$ $\mu m$, then this layer can also be used as a structured substrate layer, allowing non-destructive thinning of the rear face, and a non-destructive further processing.

A third method example relating to the production of a semiconductor wafer once again initially starts with the production of a semiconductor wafer having a large number of semiconductor chip positions arranged in rows and columns, with the circuit structures first of all being introduced into areas close to the surface at the semiconductor chip positions. This contrasts with the first method, in which this step is in fact not carried out until the semiconductor wafer has been ground thin. The semiconductor wafer is then adhesively bonded by its upper face to an intermediate mount, and is thinned from the rear face. After this, the thinned rear face of the semiconductor wafer is prepared for a resistive junction to the subsequent rear-face coating and for production of emitters and/or field-stop zones in the area of the rear face of the semiconductor wafer. After this preparation, a conductive self-supporting substrate layer can now be deposited on the rear face of the semiconductor wafer, which comprises a ternary carbide and/or a ternary nitride and/or carbon.

After this, the intermediate mount is removed from the upper face since, in fact, the self-supporting and conductive substrate layer is now present on the rear face of the semiconductor wafer. At the same time, the upper face is now thus freely accessible in order to apply a wiring structure to the upper face of the semiconductor wafer. The application of the wiring structure may be in the form of a conventional wiring structure, and/or a high-temperature-resistant, conductive wiring structure composed of ternary nitrides, ternary carbides and/or carbon can be applied.

During the preparation of the thinned rear face, in order to produce a resistive junction with areas of the semiconductor wafer close to the rear face, these areas are preferably doped with a dopant concentration in order to form resistive contact junctions and in order to produce emitters and/or field-stop zones in the area of the rear face of the semiconductor wafer. However, one precondition for this is that the intermediate mount is composed of a high-temperature resistant material and does not interfere with the doping process, or contaminate the semiconductor wafer during the process.

As a precaution, once a conductive self-supporting substrate layer has been deposited on the rear face of the semiconductor wafer, a sealing covering layer can be deposited on the substrate layer. This may be particularly advantageous when the aim is to deposit a wiring layer and to structure this wiring layer to form a wiring structure following pyrolytic deposition of a substrate layer on the rear face of the semiconductor wafer.

A fourth method example relating to the production of a semiconductor wafer has the following method steps. First of all, as in the case of the first three method examples, a semiconductor wafer is produced having a large number of semiconductor chip positions arranged in rows and columns, with dopant concentrations which are suitable for corresponding resistive junctions being introduced into areas of the semiconductor wafer close to the rear face. This can be done without any problems because the semiconductor wafer is still self-supporting in this phase. A conductive self-supporting substrate layer is then deposited on the rear face of the semiconductor wafer, with the substrate layer comprising a ternary carbide and/or a ternary nitride and/or carbon. The conductive, self-supporting substrate layer now makes it possible to thin the semiconductor wafer from the upper face, and to polish its upper face. Component structures such as source zones, body zones, field rings and/or structures for integrated circuits are now introduced into this polished upper face in the areas close to the surface of the semiconductor wafer, at the semiconductor chip positions. These may be high-temperature diffusion processes or high-temperature epitaxial processes. Finally, a conductive, high-temperature-resistant layer is deposited on the upper face of the semiconductor wafer, with the wiring layer likewise having a ternary carbide and/or a ternary nitride and/or carbon.

In contrast to the substrate layer composed of these materials, the wiring layer is in general correspondingly thinner and has a thickness of less than 5 micrometers in places. A passivation layer is then applied to this wiring layer, leaving contact pads free, with the contact pads in this case comprising a ternary carbide and/or a ternary nitride and/or carbon. If required, these contact pads can be metallized for further processing, in order to create a resistive junction for corresponding connecting elements to higher-level substrate mounts.

This method has the advantage that there is no need at all for any intermediate mounts and that, nevertheless, a semiconductor wafer is finally produced which not only has a substrate layer to which the thinned semiconductor wafer is fitted on the rear face, but also has a wiring structure on the upper face formed from the material. As in the case of previous method variants, a sealing covering layer can be applied to the substrate layer on the rear face of the semiconductor wafer, in order either to be used as an isolating intermediate layer and in order to ensure that no contamination originates from the substrate layer, or as a conductive covering layer composed of a high-melting-point highly conductive material in order subsequently to be used in its own right as a rear-face contact. The deposition of the conductive self-supporting substrate layer on the rear face, and of the wiring layer on the front face, can advantageously be carried out by means of pyrolysis. The conductive wiring layer is structured to form a wiring structure by means of dry etching, preferably by means of oxygen plasma etching.

In summary, in the area of the wafer rear face of the structure a structure can be obtained, which may be required for the operation of the component, for example a p-emitter or an n-emitter and/or a field-stop zone or else a drain zone, for example by means of ion implantation followed by diffusion. A carbon layer or a layer composed of a ternary nitride, or a layer composed of ternary carbide is then deposited on this wafer rear face and is preferably additionally doped in order to achieve as high a conductivity as possible in this layer. The thickness of a substrate layer such as this is sufficient to allow the supporting function to be carried out in a desired manner.

Instead of pyrolytic deposition or any other preferred deposition process such as vapor deposition, sputtering or CVD, it is also possible to integrally connect the silicon wafer, by means of a "wafer-bonding process" to a wafer which is composed of carbon or of a ternary nitride, and/or of a ternary carbide. A covering layer can then be deposited for sealing purposes on a substrate layer such as this, either comprising a wafer of a material or by appropriate deposition on the wafer rear face, which covering layer can on the one hand protect the substrate layer during possible oxidation steps, and on the other hand prevents contamination of the high-purity silicon wafer.

A polysilicon layer, a silicon dioxide layer or a layer composed of high-melting-point material can be used as a sealing layer such as this, in which case this layer can also be removed again, if required, at the end of the production process of the semiconductor component. The semiconductor wafer can now be thinned on its upper face to the desired final thickness, for example by grinding and polishing. Furthermore, the required processes, such as epitaxial processes, diffusion processes or implantations, can be carried out on the upper face in order to produce the corresponding component structures.

As a further variant, it would also be feasible to carry out the front-face processes that may be required for production of the component, as far as the thinning step as normal, to be precise except for the deposition of metal and passivation layers, and to carry out the required rear-face processes, which can be carried out at comparatively low temperatures, after the thinning step, such as ion implantation steps, subsequently, followed by deposition of the substrate layer composed of the material. The rear-face implantation would then be activated either during the carbon deposition by pyrolysis or during a subsequent, additional high-temperature step. The ion implantations can then also be carried out after this, in the thin wafer state.

Finally, the metal layer and the polyimide layers, which may be required for wiring, can then be deposited on the upper face of the semiconductor wafer. In the case of special semiconductor components, such as diodes, a layer composed of carbon, ternary carbide and/or ternary nitride could also be deposited on the upper face, then at the same time being used as a wiring structure. Further wiring structures can also be applied to this wiring structure, provided that appropriate isolation structures are provided in between.

A wiring structure composed of carbon and/or ternary nitride and/or ternary carbide has the advantage that passivation layers which are deposited at relatively high temperatures and are thus denser and more robust can be produced than those which are used at present for example and are deposited at relatively low temperatures, such as oxide and nitride layers. At the same time, because of the hardness of the substrate layer, less interaction can be expected between the semiconductor chip and the chip package, which leads to a comparatively robust overall system for the semiconductor component comprising the semiconductor chip and package. The high-temperature-resistant tungsten external contacts which are already used nowadays could be replaced by corresponding structured substrate layers composed of carbon and/or ternary nitride and/or ternary carbide, thus also allowing the widely used copper multilayer technology to be replaced.

As already mentioned above, the thermal coefficient of expansion of a carbon layer and/or of a ternary nitride layer and/or of a ternary carbide layer is significantly closer to the coefficient of expansion of the silicon that is nowadays used as the semiconductor material than that of metallic copper, thus resulting in more stable relationships in the event of alternating temperature loads. For example, the thermal coefficient of expansion of copper is 17 ppm/° C., that of semiconductor silicon is 2 ppm/° C. and that of pure carbon is about 1 ppm/° C. Furthermore, in particular, carbon can be finely structured by dry etching, as already explained above, in an oxygen plasma.

FIG. 1 shows, schematically, a power diode 23 formed from a semiconductor chip 14, according to a first embodiment. This power diode 3 has a semiconductor chip 14 which has been ground thin from the upper face and has a thickness $d_H$ of, for example, 30 μm. This thickness $d_H$ is created by thinning of an n-conductance type, semiconductor wafer doped with $10^{15}$ cm$^{-3}$ and with the thickness of about 350 μm, in which case the silicon wafer was subjected to ion implantation and diffusion of donors before the deposition of the substrate layer 4 on its rear face 9, so that, before the thinning of the front face, it has on its rear face 9 a heavily doped, n-conductive layer in an area 20 close to its rear face. This heavy doping in the area 20 close to the rear face ensures a resistive contact with the substrate layer 4, that is deposited on the rear face 9, with a thickness $d_c$ of, for example 150 μm, and also at the same time provides an n$^+$-doped emitter for a diode or an IGBT.

This substrate layer 4 which is deposited on the rear face 9 before the thinning process has a coating material 6 composed of a ternary nitride and/or a ternary carbide and/or a carbon. This coating 6—particularly in the case of a plastic coating—can be doped with a heavy concentration of substitutional donors in order to improve its conductivity, and at the same time supports the ground-thinned semiconductor chip 14. The doping of the coating material 6 means that this supporting substrate layer 4 is electrically very highly conductive, while the coating materials make it resistant to high temperatures. The lower face of the coating 6—particularly when using a plastic coating—has a sealing covering layer 7 composed of polysilicon which ensures that the surface 11 of the ground-thinned semiconductor wafer is not contaminated during doping of the upper face of the surface 11.

As a result of ion implantation by acceptor material in the ground-thin upper face 11 of the semiconductor wafer, this power diode 23 has a p-conductive area 19 close to the surface, which is doped with an acceptor concentration of, for example, $10^{18}$ cm$^{-3}$, so that a pn junction is formed at a depth t of about 2 to 5 μm. Additionally, on its upper face 11, the power diode 23 has a metal layer 24 composed of aluminum, which forms an anode A of the diode D, while the cathode K is formed by the covering layer 7 that is composed of polycrystalline silicon.

A semiconductor component 13 such as this and of semiconductor chip size has the advantage that, on the one hand, it has a low on-state resistance by virtue of the thinned semiconductor area and, on the other hand, has the advantage that it is mechanically completely stable, since the substrate layer 4 which is applied to the rear face 9 and forms the rear-face contact or the cathode K is produced from a highly conductive, temperature-resistant coating material 6 composed of carbon and/or a ternary nitride and/or a ternary carbide.

Two method examples related to the production of semiconductor components such as these are introduced in the following figures, in which the area 19 which is close to the surface and has a relatively simple structure for a diode 23 such as this is replaced by a more complex structure of integrated circuits and/or of high-power field-effect components.

FIGS. 2 to 9 show schematic cross sections through a section of a semiconductor wafer 3 during the production of a semiconductor chip 14, according to a first exemplary embodiment.

FIG. 2 shows a schematic cross section through a section of a semiconductor wafer 3, which has a highly polished upper face 11 and a rear face 9. The semiconductor wafer 3 has semiconductor chip positions 2 arranged in rows and columns, whose boundaries are marked by dashed-dotted lines 25 in this illustration. In this method example, the semiconductor wafer has a monocrystalline semiconductor material, with the rear face 9 being illustrated located at the top in the illustration in FIGS. 2 to 4.

FIG. 3 shows a schematic cross section through the section of the semiconductor wafer 3 as shown in FIG. 2, after preparation of an area 20, which is close to the rear face, of the semiconductor wafer 3. Depending on the semiconductor component type that is intended to be produced, this rear-face preparation may comprise a p-emitter or n-emitter layer and/or a field-stop zone or else a drain zone which, for example, is introduced by means of the normal ion implantation methods, with subsequent diffusion. In this case, flat resistive junctions 18 can be prepared for a coating material, which will be deposited later.

FIG. 4 shows a schematic cross section through the section of the semiconductor wafer 3 as shown in FIG. 2, after application of a substrate layer 4 to the prepared rear face 9 of the semiconductor wafer 3. This application process may comprise pyrolytic decomposition of carbon and/or of a ternary nitride and/or a ternary carbide to a substrate layer 4. The thickness of this substrate layer 4 is of such a size that it is dimensionally stable and is self-supporting. The thickness $d_c$ of the substrate layer is preferably 50 μm $\leq d_c \leq$ 300 μm, in particular 50 μm $\leq d_c \leq$ 150 μm. Instead of a deposited substrate layer 4 composed of the corresponding materials, a prepared wafer composed of the coating material 6 of the substrate layer 4 can also be integrally fixed to the rear face 9 of the semiconductor wafer, for example by use of the "wafer-bonding" process.

FIG. 5 shows a schematic cross section through the section of the semiconductor wafer 3 as shown in FIG. 4, after thinning of the semiconductor wafer 3 to a thickness $d_H$. The ground-thin and polished surface 11 of the ground-thinned semiconductor wafer 12 which is now freely accessible can now be structured by means of appropriate high-temperature steps, for example with epitaxial layers and/or with diffusion layers to form corresponding high-power components or integrated circuits. In this case, however—particularly when using a carbon layer—there is a risk of the coating material 6 of the substrate layer 4 contaminating and/or rendering impure the high-purity silicon material of the ground-thinned semiconductor wafer 12, so that it may be advantageous to seal the lower face of the substrate layer 4 before the high-temperature steps.

FIG. 6 shows a schematic cross section through the section of the semiconductor wafer 3 as shown in FIG. 5, after sealing of the substrate layer 4 with a sealing covering layer 7 composed, for example, of heavily doped polysilicon. This heavily doped polysilicon has the advantage that it does not emit any disturbing extraneous-substance atoms into the hot surrounding process atmosphere, in some cases above 1000° C., during the high-temperature processes for structuring of those areas 19 of the thinned semiconductor wafer 12 which are close to the surface. During these structuring processes in the areas 19 of the thinned semiconductor wafer 12 which are close to the surface at the individual semiconductor chip positions 2, not only are new structures formed in the areas 19 close to the surface, but protective, isolating oxide layers can also be formed on the upper face 11, and are often used as ion implantation masks or diffusion masks.

Figure 7:
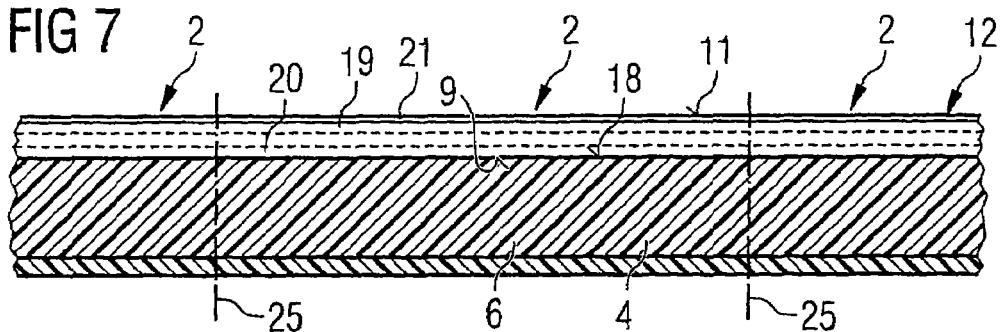

FIG. 7 shows a schematic cross section through the section of the thinned semiconductor wafer 12 as shown in FIG. 6, after introduction of semiconductor element structures into those areas 19 of the semiconductor wafer 12 which are close to the surface, and after application of an isolation structure 21 to the upper face 11 of the semiconductor wafer 12.

After the structuring of the upper face 11 of the thinned semiconductor wafer 12 in areas 19 close to the surface, a wiring layer 5 can now be deposited on the isolation structure 21.

Figure 8:
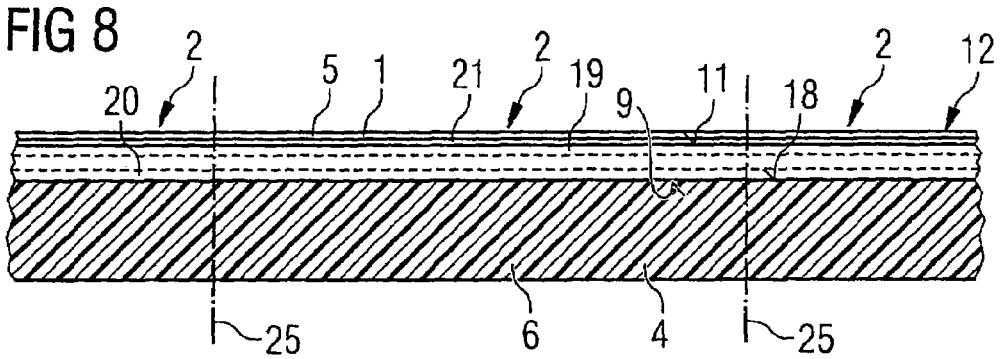

FIG. 8 shows a schematic cross section through the section of the thinned semiconductor wafer 12, as shown in FIG. 7, after application of a wiring structure 1 to the isolation structure 21. For this purpose, windows are left open in the isolation structure 21 and allow contacts to be fitted to the areas 19 close to the surface. In this exemplary embodiment of the method, a wiring layer 5 is first of all deposited for the wiring structure 1, with this wiring layer 5 being composed of carbon and/or ternary nitride and/or a ternary carbide.

A high-temperature-resistant and conductive wiring layer 5 such as this has the advantage that high-temperature processes can be carried out with wiring layers 5 applied, without changing the characteristics of the wiring layer 5. Furthermore, it is possible to apply passivation layers which have a considerably denser material than the passivation layers composed of silicon nitride or silicon dioxide that have been deposited until now at low temperatures. Before the application of a passivation layer, the wiring layer 5 can also be structured to form a wiring structure 1, by carrying out selective dry etching, preferably in an oxygen plasma. Dry etching such as this allows exact wiring structures 1 to be produced, which have interconnects, contact pads and other geometries, on the upper face 11 of the thinned semiconductor wafer 12.

Figure 9:
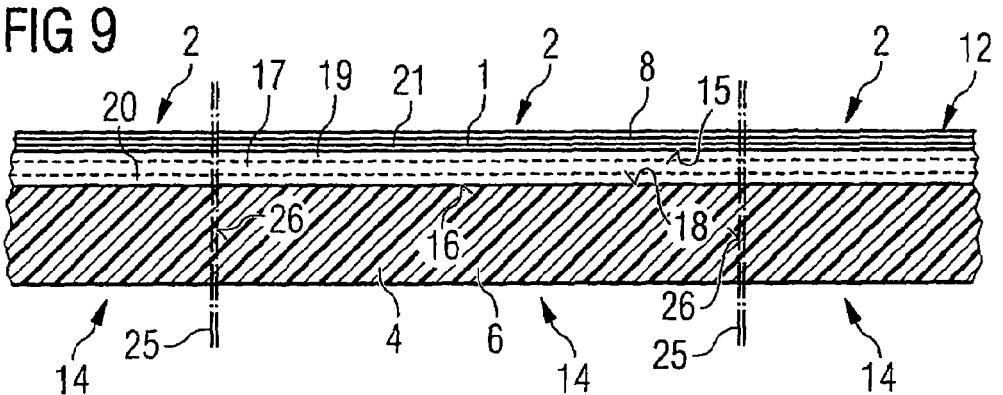

FIG. 9 shows a schematic cross section through the section of the thinned semiconductor wafer 12 as shown in FIG. 8, after application of a passivation layer 8 to the wiring structure 1. For this purpose, a high-density passivation layer 8 composed, for example, of silicon nitride can be deposited using a high-temperature process on the wiring structure 1, which is composed of carbon, a ternary carbide and/or a ternary nitride. The semiconductor wafer 12 is then cut along the edges 26 of the semiconductor chip positions 2 to form semiconductor chips 14. After the semiconductor wafer has been cut into semiconductor chips 14, these semiconductor chips 14 can be processed to form components of semiconductor chip size, and/or can be subjected to processes in order to introduce them into the corresponding packages for semiconductor components. Once the semiconductor wafer 12 has been cut along the cutting lines 25 into semiconductor chips 14, each thinned semiconductor chip 17 has a rear face 16 with flat resistive junctions 18, and an upper face 15 with structured areas 19 close to the surface.

FIGS. 10 to 17 show schematic cross sections through a detail of a semiconductor wafer 3 during the production of a semiconductor chip 14, according to a second method example. Components with the same functions as in the previous figures are annotated with the same reference symbols in FIGS. 10 to 17, and will not be explained again.

First of all, a semiconductor wafer 3, a cross section through which is shown in FIG. 10, is also produced in the second method example.

In contrast to the first method example, in the case of the second method example, the rear face 9 of the unthinned semiconductor wafer 3 is now not treated, but semiconductor element structures are introduced into the areas 19 of the semiconductor wafer 3 which are close to the surface, for the respective semiconductor chip positions 2. The semiconductor element structures in the area 19 close to the surface are then protected by an isolation layer 21. Effectively, this completes the process in the areas 19 of the semiconductor wafer 3 which are close to the surface, so that, in this second method example, the thinning of the semiconductor wafer 3 can be carried out from the rear face 9 of the semiconductor wafer 3.

FIG. 12 shows a schematic cross section through the section of a semiconductor wafer 3 as shown in FIG. 11, after the semiconductor wafer 3 has been adhesively bonded by its upper face 11 onto an intermediate mount 22. This intermediate mount 22 may itself be a semiconductor wafer or a wafer composed of carbon, or a wafer composed of a ternary carbide or a ternary nitride. The integral fitting of the semiconductor wafer 3 to the intermediate mount 22 can be carried out by means of a temperature-resistant, adhesive film 27, so that the intermediate mount 22 and the semiconductor wafer 3 to be thinned are integrally fixed to one another.

FIG. 13 shows a schematic cross section through the section of the semiconductor wafer 3 as shown in FIG. 12, after thinning of the semiconductor wafer 3 from its rear face 9. The thinned semiconductor wafer 12 is now held by the dimensionally stable, self-supporting intermediate mount 22, while the structures which may be required for different semiconductor components are introduced on the rear face 9 of the thinned semiconductor wafer 12, in the areas 20 which are close to the rear face.

Figure 14:
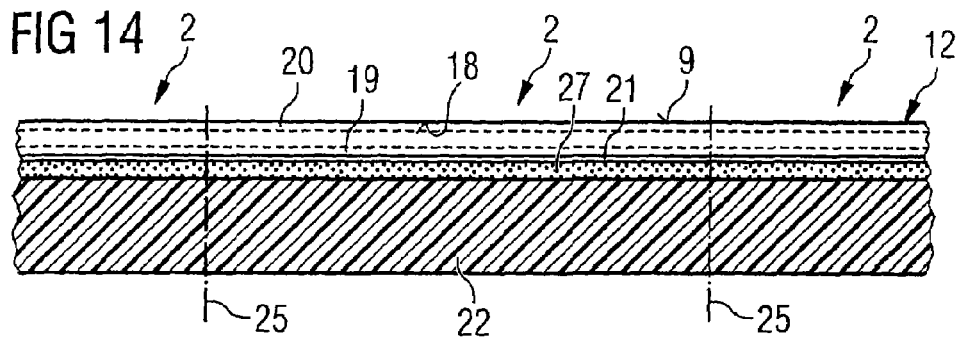

FIG. 14 shows a schematic cross section through the section of a thinned semiconductor wafer 12 as shown in FIG. 13, after preparation of areas 20 of the semiconductor wafer 12 which are close to the rear face. During this method step, the intermediate mount 22 is also integrally connected via a high-temperature-resistant adhesive film 27.

Figure 15:
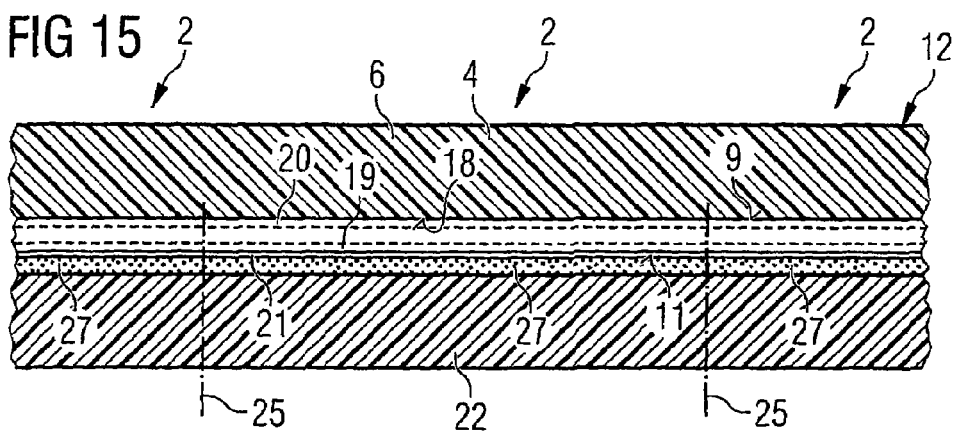

FIG. 15 shows a schematic cross section through the section of the semiconductor wafer 12 as shown in FIG. 14, after application of a substrate layer 4 to the rear face 9 of the semiconductor wafer 12. For this purpose, a substrate layer 4 in the form of a coating material 6 composed of carbon and/or a ternary carbide and/or a ternary nitride is deposited on the rear face 9 of the thinned semiconductor wafer 12. After the deposition of this substrate layer 4, the intermediate mount 22 and the adhesive film 27 can be removed. If required, high-temperature steps can also be carried out after this, for activation of and/or for carrying out diffusion processes, before the deposition of the substrate layer 4 for implanted doping layers.

Figure 16:
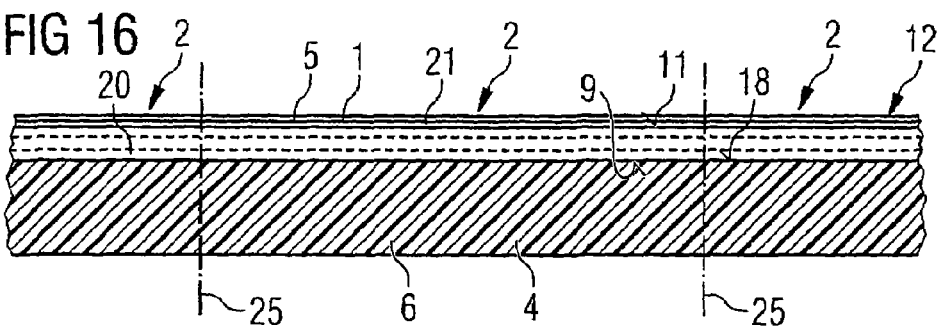
Figure 17:
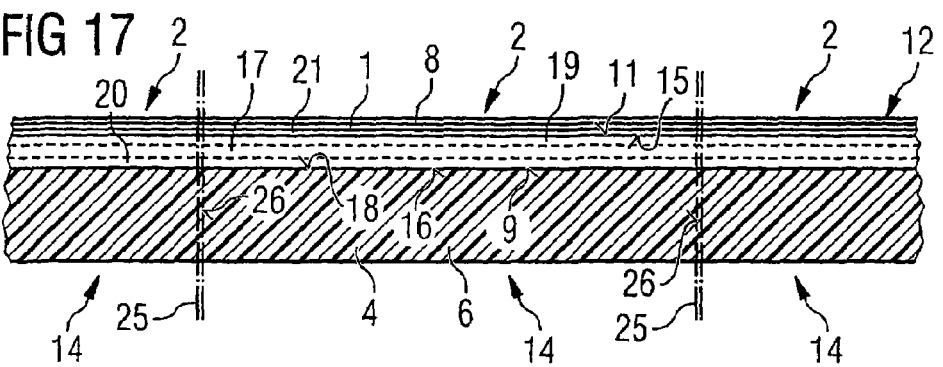

FIG. 16 shows a schematic cross section through the section of a thinned semiconductor wafer 12 as shown in FIG. 15, after removal of the intermediate mount 22 and application of a wiring layer 5 to the isolation structure 21. This wiring layer 5 preferably has carbon and/or a ternary carbide and/or a ternary nitride, and is structured with the aid of dry etching, for example by means of an oxygen plasma, to form a wiring structure 1, as shown in FIG. 17. On the other hand, the wiring layer may also be composed of conventional metal layers, such as aluminum.

FIG. 17 shows a schematic cross section through the section of a thinned semiconductor wafer 12 as shown in FIG. 16, after application of a passivation layer 8 to the wiring structure 1. The passivation layer 8 may in this case be composed of a high-density silicon nitride, which has been deposited on the wiring structure 1 at a high process temperature. The thinned semiconductor wafer 12 together with the substrate layer 4 can then be cut into individual semiconductor chips 14 along the edges 26 of the semiconductor chip positions 2.

LIST OF REFERENCE SYMBOLS

1 Wiring structure
2 Semiconductor chip position
3 Semiconductor wafer
4 Substrate layer
5 Wiring layer
6 Coating material
7 Covering layer
8 Passivation layer
9 Rear face of the semiconductor wafer
11 Upper face of the semiconductor wafer
12 Thinned semiconductor wafer
13 Semiconductor component
14 Semiconductor chip
15 Upper face of the semiconductor chip
16 Rear face of the semiconductor chip
17 Thinned semiconductor chip
18 Flat resistive junctions
19 Areas close to the surface with a circuit structure
20 Areas close to the rear face with heavy doping
21 Isolation structure
22 Intermediate mount
23 Power diode
24 Metal layer
25 Dashed-dotted line
26 Edge of the semiconductor chip positions
27 Adhesive film
28 PN junction
A Anode
K Cathode
D Diode
t PN junction depth
$d_H$ Semiconductor chip thickness
$d_C$ Substrate layer thickness
$d_v$ Wiring layer thickness

What is claimed is:

1. A method for production of a semiconductor wafer, wherein the method comprises the following method steps:
   production of a semiconductor wafer with a plurality of semiconductor chip positions arranged in rows and columns, wherein the rear face of the semiconductor wafer comprises a dopant concentration in areas close to the rear face for corresponding flat resistive junctions;
   deposition of a conductive self-supporting substrate layer on the rear face of the semiconductor wafer, wherein the substrate layer comprises a ternary carbide and/or a ternary nitride and/or carbon;
   thinning of the semiconductor wafer from the upper face of the semiconductor wafer, and polishing of its upper face;
   introduction of circuit structures into the semiconductor chip positions in areas close to a surface of the upper face of the semiconductor wafer;
   application of wiring structures and isolation structures to the upper face of the semiconductor wafer at the semiconductor chip positions;
   application of a passivation layer to the wiring structures and isolation structures, leaving metallic contact pads free.

2. A method as claimed in claim 1, wherein a sealing covering layer is deposited on the substrate layer after the deposition of the conductive self-supporting substrate layer on the rear face of the semiconductor wafer.

3. A method as claimed in claim 1, wherein the deposition of a conductive self-supporting substrate layer on the rear face of the semiconductor wafer is carried out by means of pyrolysis, sputtering, vapor deposition or chemical deposition from the gas phase.

4. A method for production of a semiconductor wafer, wherein the method comprises the following method steps:
   production of a semiconductor wafer with a plurality of semiconductor chip positions arranged in rows and columns, wherein the rear face of the semiconductor wafer comprises a dopant concentration in areas close to the rear face for corresponding flat resistive junctions;
   introduction of circuit structures at the semiconductor chip positions in areas close to a surface of the upper face of the semiconductor wafer;
   deposition of a conductive wiring layer on the upper face of the semiconductor wafer, wherein the wiring layer comprises a ternary carbide and/or a ternary nitride and/or carbon;
   structuring of the conductive wiring layer to form a wiring structure;
   application of a passivation layer onto the wiring structure leaving contact pads free which comprise a ternary carbide and/or a ternary nitride and/or carbon;
   metallization of the contact pads.

5. A method as claimed in claim 4, wherein during the deposition of the conductive wiring layer for the wiring structure, a ternary carbide and/or a ternary nitride and/or carbon are/is deposited on the rear face and/or on the upper face of the semiconductor wafer by means of pyrolysis, sputtering, vapor deposition or chemical deposition from the gas phase.

6. A method as claimed in claim 4, wherein the structuring of the conductive wiring layer to form a wiring structure is carried out by means of dry etching, preferably by means of oxygen plasma etching.

7. A method for production of a semiconductor wafer, with the method having the following method steps:
   production of a semiconductor wafer with a number of semiconductor chip positions arranged in rows and columns, with circuit structures being introduced at the semiconductor chip positions in areas close to a surface of the upper face of the semiconductor wafer;
   adhesive bonding of the upper face of the semiconductor wafer onto an intermediate mount, and thinning of the semiconductor wafer from the rear face;
   preparation of the thinned rear face of the semiconductor wafer for a resistive junction with the subsequent rear-face coating;
   deposition of a conductive self-supporting substrate layer on the rear face of the semiconductor wafer, which has a ternary carbide and/or a ternary nitride and/or carbon;
   removal of the intermediate mount from the upper face;

application of a wiring structure to the upper face of the semiconductor wafer.

8. A method as claimed in claim 7, wherein for preparation of the thinned rear face for a resistive junction, the area of the semiconductor wafer close to the rear face is doped with a dopant concentration in order to form resistive contact junctions.

9. A method as claimed in claim 7, wherein in order to prepare the thinned rear face, heating are carried out for activation and for carrying out diffusion processes before deposition of a substrate layer on the rear face for implanted doping layers.

10. A method as claimed in claim 7, wherein after the deposition of a conductive self-supporting substrate layer on the rear face of the semiconductor wafer, a sealing covering layer is deposited on the substrate layer.

11. A method for production of a semiconductor wafer, wherein the method comprises the following method steps:
  production of a semiconductor wafer with a plurality of semiconductor chip positions arranged in rows and columns, wherein a dopant concentration is introduced into the rear face of the semiconductor wafer for corresponding flat resistive junctions;
  deposition of a conductive self-supporting substrate layer on the rear face of the semiconductor wafer, wherein the substrate layer comprises a ternary carbide and/or a ternary nitride and/or carbon;
  thinning of the semiconductor wafer from the upper face, and polishing of its upper face;
  introduction of circuit structures at the semiconductor chip positions in areas close a surface of the upper face of the semiconductor wafer;
  deposition of a conductive wiring layer on the upper face of the semiconductor wafer, wherein the wiring layer comprises a ternary carbide and/or a ternary nitride and/or carbon;
  structuring of the conductive wiring layer to form a wiring structure;
  application of a passivation layer to the wring structure, leaving contact pads free, wherein the contact pads comprise a ternary carbide and/or a ternary nitride and/or carbon;
  metallization of the contact pads.

12. A method as claimed in claim 11, wherein after the deposition of a conductive self-supporting substrate layer on the rear face of the semiconductor wafer, a sealing covering layer is deposited on the substrate layer.

13. A method as claimed in claim 11, wherein the deposition of a conductive self-supporting substrate layer on the rear face of the semiconductor wafer is carried out by means of pyrolysis, sputtering, vapor deposition or chemical deposition from the gas phase.

14. A method as claimed in claim 11, wherein the structuring of the conductive wiring layer to form a wiring structure is carried out by means of dry etching, preferably by means of oxygen plasma etching.

* * * * *